(12) United States Patent
Yeung et al.

(10) Patent No.: US 8,456,199 B2
(45) Date of Patent: Jun. 4, 2013

(54) REDUCING CURRENT LEAKAGE IN A SEMICONDUCTOR DEVICE

(75) Inventors: Gus Yeung, Austin, TX (US); Hemangi Umakant Gajjewar, Sunnyvale, CA (US)

(73) Assignee: ARM Limited, Cambridge (GB)

( * ) Notice: Subject to any disclaimer, the term of this patent is extended or adjusted under 35 U.S.C. 154(b) by 94 days.

(21) Appl. No.: 12/926,966

(22) Filed: Dec. 20, 2010

(65) Prior Publication Data

US 2011/0187438 A1    Aug. 4, 2011

Related U.S. Application Data

(60) Provisional application No. 61/288,384, filed on Dec. 21, 2009.

(51) Int. Cl.
*H03B 1/00* (2006.01)
*H03K 3/00* (2006.01)

(52) U.S. Cl.
USPC .......................................... 327/108; 327/139

(58) Field of Classification Search
USPC ................................................. 327/108, 139
See application file for complete search history.

(56) References Cited

U.S. PATENT DOCUMENTS

| | | | |
|---|---|---|---|
| 7,219,244 B2* | 5/2007 | Kuang et al. ................... 713/320 |
| 7,266,707 B2* | 9/2007 | Ngo et al. ...................... 713/300 |
| 7,276,932 B2* | 10/2007 | Kuang et al. .................... 326/33 |
| 7,737,720 B2* | 6/2010 | Idgunji et al. ................... 326/33 |
| 8,134,874 B2* | 3/2012 | Shiu et al. ................. 365/189.06 |
| 2008/0012424 A1* | 1/2008 | Shin et al. ......................... 307/28 |
| 2008/0123458 A1* | 5/2008 | Cheng et al. .................... 365/227 |
| 2008/0272652 A1* | 11/2008 | Idgunji et al. .................... 307/38 |
| 2008/0272809 A1* | 11/2008 | Idgunji et al. .................... 327/78 |
| 2010/0182850 A1* | 7/2010 | Shiu et al. ................. 365/189.07 |
| 2010/0329044 A1* | 12/2010 | Yeung ...................... 365/189.16 |
| 2011/0187438 A1* | 8/2011 | Yeung et al. ................... 327/419 |
| 2012/0014192 A1* | 1/2012 | Patil et al. ................ 365/189.11 |

* cited by examiner

*Primary Examiner* — Adam Houston
(74) *Attorney, Agent, or Firm* — Nixon & Vanderhye, P.C.

(57) ABSTRACT

An integrated circuit, method of controlling power supplied to semiconductor devices, a method of designing an integrated circuit and a computer program product are disclosed. The integrated circuit comprises: a semiconductor device for handling data; a power source for powering said semiconductor device, said power source comprising a high voltage source for supplying a high voltage level and a low voltage source for supplying a low voltage level; a plurality of switching devices arranged between at least one of the high or low voltage sources and the semiconductor device. There is also a control device for controlling a first set of the plurality of switching devices to connect one of the high or low voltage sources to the semiconductor device and for controlling a second set of the plurality of switching devices to connect the one of the high or low voltage sources to the semiconductor device. At least some of the first set of the plurality of switching devices have a higher resistance when closed and providing a connection than at least some of the second set of the plurality of switching devices such that when the first set of the plurality of switching devices connect the semiconductor device to the one of the voltage sources the semiconductor device operates with a lower performance than when the second set of the plurality of switching devices connect the semiconductor device to the one of said voltage sources.

13 Claims, 6 Drawing Sheets

REDUCING CURRENT LEAKAGE IN A SEMICONDUCTOR DEVICE

This application claims priority to U.S. Provisional Application No. 61/288,384, filed Dec. 21, 2009, the entire contents of which are hereby incorporated by reference.

BACKGROUND OF THE INVENTION

1. Field of the Invention

The field of the invention relates to semiconductor data handling devices and in particular, ways of reducing the power consumption of such devices.

2. Description of the Prior Art

There is an ever increasing desire to reduce the power consumption of semiconductor devices and to increase their performance. In order to provide high performance, threshold voltages have been scaled down as a lower threshold voltage allows a device to react more quickly. However, lower threshold voltages also result in higher leakage currents. In some devices such as memory this sub-threshold leakage dominates overall power consumption of the memory.

In order to reduce power consumption it is known to power gate devices, such that switching devices, either headers or footers are added to isolate a circuit from a power rail when the circuit enters an inactive mode. These devices need to be large devices so that they do not impede current flow in operational mode. A problem with such a system is that these large devices provide a substantial time delay in both powering down and powering up of the circuit. Furthermore, the delay for powering up must be carefully managed to control the inrush current, this control may result in a further increase to the wakeup time.

It would be desirable to provide a semiconductor system with lower power consumption, while maintaining performance when required.

SUMMARY OF THE INVENTION

A first aspect of the present invention provides an integrated circuit comprising: a semiconductor device for handling data; a power source for powering said semiconductor device, said power source comprising two voltage sources a high voltage source for supplying a high voltage level and a low voltage source for supplying a low voltage level; a plurality of switching devices arranged between at least one of said two voltage sources and said semiconductor device; a control device for controlling a first set of said plurality of switching devices to connect said one of said two voltage sources to said semiconductor device and for controlling a second set of said plurality of switching devices to connect said one of said two voltage sources to said semiconductor device; wherein at least some of said first set of said plurality of switching devices have a higher resistance when closed and providing a connection than at least some of said second set of said plurality of switching devices such that when said first set of said plurality of switching devices connect said semiconductor device to said one of said two voltage sources said semiconductor device operates with a lower performance than when said second set of said plurality of switching devices connect said semiconductor device to said one of said two voltage sources.

The present invention recognises the problems associated with increased power consumption due to leakage currents particularly of low threshold voltage devices. It also recognises that such devices are required for high performance operations and that although power can be saved by power gating these devices when they are inactive, such power gating generates delays when powering up or powering down so that its use for short periods of inactivity is not worthwhile. The present invention addresses these problems by providing two sets of switching devices, one having a higher resistance when closed than the other. The higher resistance devices impede current leakage and help reduce power consumption, however, they also reduce the performance of the circuit. Thus, one set of switching devices can be closed when a high performance mode of operation is required, while the other set can be closed when a lower performance mode is acceptable. In this way power consumption can be reduced without powering the circuit down. Furthermore, the switch back to high performance operation from the low performance mode can be made more quickly and without the same inrush current problem as occurs when switching from inactive to high performance mode.

Although the higher resistance of the first set of switching devices compared with the second set of switching devices can be achieved in a number of ways, in some embodiments said first set of said plurality of switching devices comprise switching devices at least some of which have a higher threshold voltage than switching devices of said second set of switching devices.

Providing one set of switching devices with a higher threshold voltage compared to the other set is one way of providing a set of switching devices that have a higher resistance when closed, and thus, reduce both leakage currents and performance of the device that they are feeding current to.

In some embodiments said plurality of switching devices comprise transistors, at least some of said transistors of said first set of switching devices having a lower gate width than at least some of said transistors of said second set of switching devices.

One way of providing the switching devices is to use transistors. In such a case, transistors of different gate widths can be used to generate the different performances. Thus, transistors with the lower gate width can be used to provide a connection during low performance mode whereas those with the higher gate width can be used to provide the connections during high performance mode.

In some embodiments, said integrated circuit is configured to operate in one of three modes, an inactive mode where said semiconductor device is isolated from at least one of said voltage sources, a low performance mode where said semiconductor device is connected to said one of said high or low voltage sources by said first set of switching devices, and a high performance mode where said semiconductor device is connected to said one of said high or low voltage sources by at least said second set of switching devices.

The integrated circuit may operate in three modes of operation with the switching devices acting as power gating devices such that when they are all open the integrated circuit is in low power mode and is isolated from the voltage sources.

It should be noted that although in high performance mode the semiconductor device may be connected to the voltage source via the second set of switching devices, it may also be connected to the voltage source by both the first and second set of switching devices. Although, most of the current will flow through the second set of switching devices, the first set of switching devices will provide additional links and furthermore, if they are left closed when switching from low performance to high performance mode then power is saved and unnecessary switching of devices is avoided.

In some embodiments, in said high performance mode said semiconductor device operates at a higher frequency than in said low performance mode.

In the high performance mode the device can operate at a higher frequency and perform tasks that it is important that it performs quickly. In the lower performance mode where the device is perhaps not on the critical path or is not performing a critical operation then it can operate more slowly at a lower frequency and thus, the current requirements can be fulfilled by the higher resistance switching devices. Although the semiconductor device can be a number of things, in some embodiments if comprises a semiconductor memory device.

Semiconductor memory devices benefit from this technique as there are often times when it is acceptable for them to operate in a lower performance mode and furthermore leakage currents associated with these devices can be a significant part of their power consumption.

In some embodiments, the integrated circuit comprises a further semiconductor device, said further semiconductor device being connected to said one of said high or low voltage sources by a plurality of switching devices comprising a first and second set, wherein said further semiconductor device is configured such that said second set of switching devices are configured to be always open such that said further semiconductor device is configured to operate either in an inactive mode where all of said plurality of switching devices are open and said further semiconductor device is isolated from said one of said high or low voltage sources or in a low performance mode where said first set of said plurality of switching devices connect said at least one further semiconductor device to said one of said high or low voltage source.

It may be that there is a semiconductor device controlled by these switches where one determines that it will not need to operate at the higher performance level, it may for example not be on a critical path. In such a case, the second set of switching devices can be configured to be always open such that they are never closed and thus, this device is either in an inactive mode where it is isolated by all the switches from the voltage source or the first set of switches are closed and it operates in a low performance mode where leakage current are constrained.

A second aspect of the present invention provides a method of designing an integrated circuit comprising: providing at least one semiconductor device for handling data to be powered by a high voltage source and a low voltage source; providing a plurality of switching devices between at least one of said high or low voltage sources and said at least one semiconductor device; providing a control device for controlling a first set of said plurality of switching devices to connect said at least one of said high or low voltage sources to said at least one semiconductor device and for controlling a second set of said plurality of switching devices to connect said at least one of said high or low voltage sources to said at least one semiconductor device; wherein at least some of said first set of said plurality of switching devices have a higher resistance when closed and providing a connection than at least some of said second set of said plurality of switching devices such that when said first set of said plurality of switching devices connect said semiconductor device to said one of said voltage sources said at least one semiconductor device operates with a lower performance than when said second set of said plurality of switching devices connect said at least one semiconductor device to said one of said voltage sources.

In some embodiments, the method further comprises determining that said at least one semiconductor device is not on a critical path within said integrated circuit and configuring said control device to control said second set of switches to be always open such that said at least one semiconductor device is configured to operate either in an inactive mode where it is isolated from said at least one of said high or low voltage source or in a low performance mode where it is connected to said at least one of said high or low voltage source by said first set of switches.

When designing the integrated circuit it may be determined that the semiconductor device is not on a critical path, whereupon the second set of switches can be configured to be always open. In this way, a single design method can be used for designing semiconductor devices that can operate in high performance mode and semiconductor devices that are configured to never operate in this mode.

A further aspect of the present invention provides a computer readable medium carrying a computer program, the computer program being configured to control a computer to perform a method according to a second aspect of the present invention to generate an integrated circuit according to a first aspect of the present invention.

The semiconductor device may be generated by a computer program and in such a case, it may be convenient for the program to be able to generate from the same design a device that can operate in three modes or a device that can operate in a low performance and low power mode or a device that can operate in a high performance and lower power mode. This provides flexibility of design from the same computer program.

A fourth aspect of the present invention provides a method of controlling a mode of operation of a semiconductor device for handling data comprising the steps of: initiating a high performance mode by connecting said semiconductor device to a voltage source via a plurality of switching devices; initiating a low performance mode by connection said semiconductor device to said voltage source via a subset of said plurality of switching devices, said subset comprising switching devices with a higher resistance when turned on than at least some of said plurality of switching devices not within said subset; initiating an inactive mode by isolating said semiconductor device from said voltage source by said plurality of switching devices.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
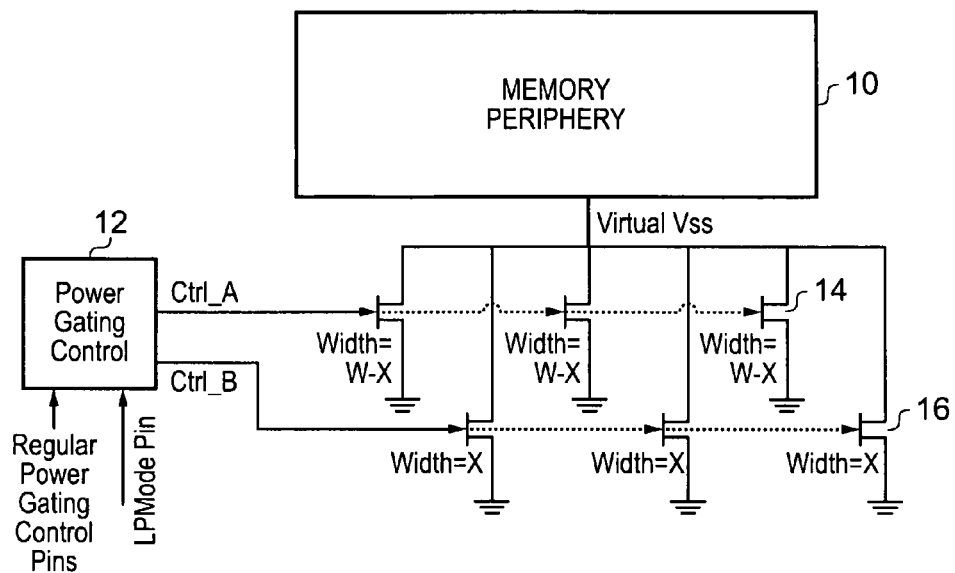
FIG. 1 shows a memory device with power control circuitry according to an embodiment of the present invention.

FIG. 1 shows a memory device 10 that is powered by a voltage difference between a high voltage rail not shown and a low voltage rail virtual VSS. In this embodiment VSS is ground voltage.

The supply of power from the ground voltage rail is controlled by power gating control circuitry 12 in the form of footer transistors. Power gating control circuitry 12 controls two sets of switching devices a first set 14 and a second set 16.

The first set 14 are controlled by control signal A and have a width of W-X which is a larger width than the other transistors that have a width of X. Thus, these are wide transistors and therefore have a relatively unrestricted current flow through them and are therefore suitable as connection devices during a high performance mode but they do have a relatively high leakage current. These footers are designed to drive load with minimum performance penalty. As a consequence, there is a large penalty in delay to shut off these footers. Also wake up from the power down mode needs to be carefully managed to control inrush current which can cause long wake up times.

There are a second set of footer devices 16 that are narrower devices and that are used during low performance operations. These are controlled by control signal B.

These reduced sized switching devices 16 are used to provide power connection to the memory during a low performance mode and switching from inactive mode to low performance mode by turning these devices on results in a low inrush current due to their relatively high resistance.

However, switching from low performance mode to high performance mode can be performed relatively quickly using the higher width devices 16 and as the rail is already at VSS the inrush current is not a problem.

Power gating control circuitry 12 is responsive to the LP mode pin which is the low performance or low power mode pin. In response to a low performance request control signal B turns on the narrow footer devices 16 and controls signal A turns off the wider footer devices 14. In this arrangement, the driving capacity of the memory will reduce and it will enter a low power mode with a lower frequency of operation.

If the memory 10 is to enter a high performance mode from this low performance mode then the footer devices 14 are turned on and the memory can then operate in the higher performance mode. As noted earlier the switching from low performance to high performance mode can be performed quite quickly as virtual VSS is already at a voltage close to ground and thus, the switching of the devices 14 will not generate a large inrush current and the virtual VSS can be pulled down slightly closer to ground relatively quickly.

If memory device 10 enters an inactive mode then both sets of transistors are turned off and the virtual VSS line floats.

Figure 2A:
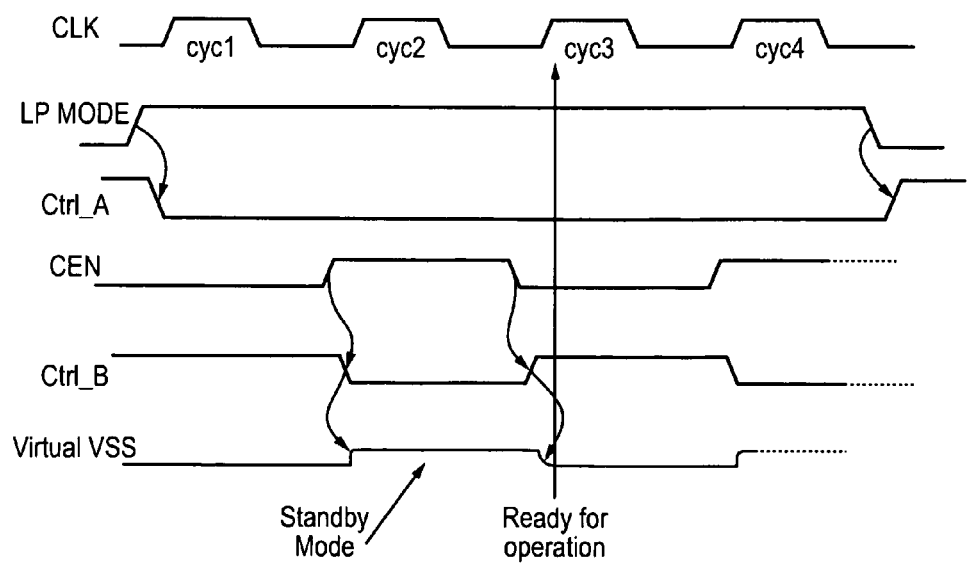
FIG. 2a shows a timing diagram illustrating operation of the memory circuit of FIG. 1 in the different performance modes of operation.

FIG. 2a shows a timing diagram associated with control of the circuit of FIG. 1. Initially power mode control signal A is pulled low which turns off the wider transistors 14. At this point low power mode control signal B is high and thus the narrow transistors 16 are on and the system can operate at a low frequency shown by cyc1 and cyc3. The system then enters an inactive mode and in response to a CEN signal the control signal B goes low and both switches 14 and 16 are switched off and virtual VSS floats.

CEN then goes low indicating the inactive state is to be exited and the system switches first to low power mode by sending the control signal B high. This switches narrow switches 16 on and as these switches have a relatively high resistance the inrush current is restricted and the memory operates in low performance mode. Thus, switching from inactive mode to low performance mode does not need to have timing control. If high power mode is then switched to (not shown) the control signal A would go high and the wider transistors 14 would switch on providing a low resistance connection to the memory 10 allowing a large current to flow and high frequency operation to be performed. Switching from low power mode to high power mode does not produce a large inrush current as the virtual low voltage rail is already close to VSS.

It should be noted that the clock frequency shown there is the clock frequency of low performance mode which is slow. High performance mode will have a higher clocking frequency.

Figure 2B:
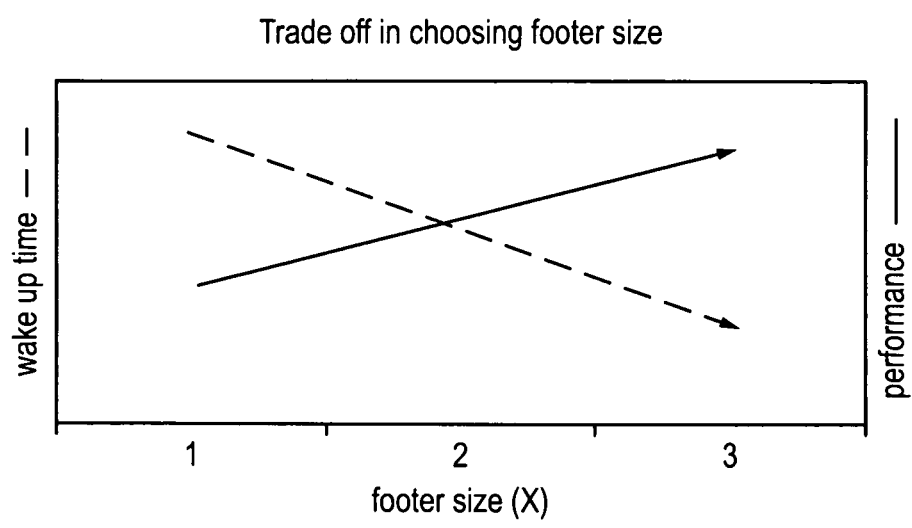
FIG. 2b shows trade off in wake up time and performance with the size of the footer devices.

It should be noted that the size of the devices 16 with width X determines both the wake up time and the performance. FIG. 2b shows very schematically such a trade off. Thus, in general as the footer size increases so does the performance of the memory as is shown by the full line. However, as footer size increases the wake up time decreases as is shown by the dotted line. Leakage current also increases with increasing size of footer device although this is not shown. Using narrow footer devices in low performance mode means that their lower performance and wake up times are acceptable in this mode, and their reduced leakage currents are a decided advantage.

Figure 3:
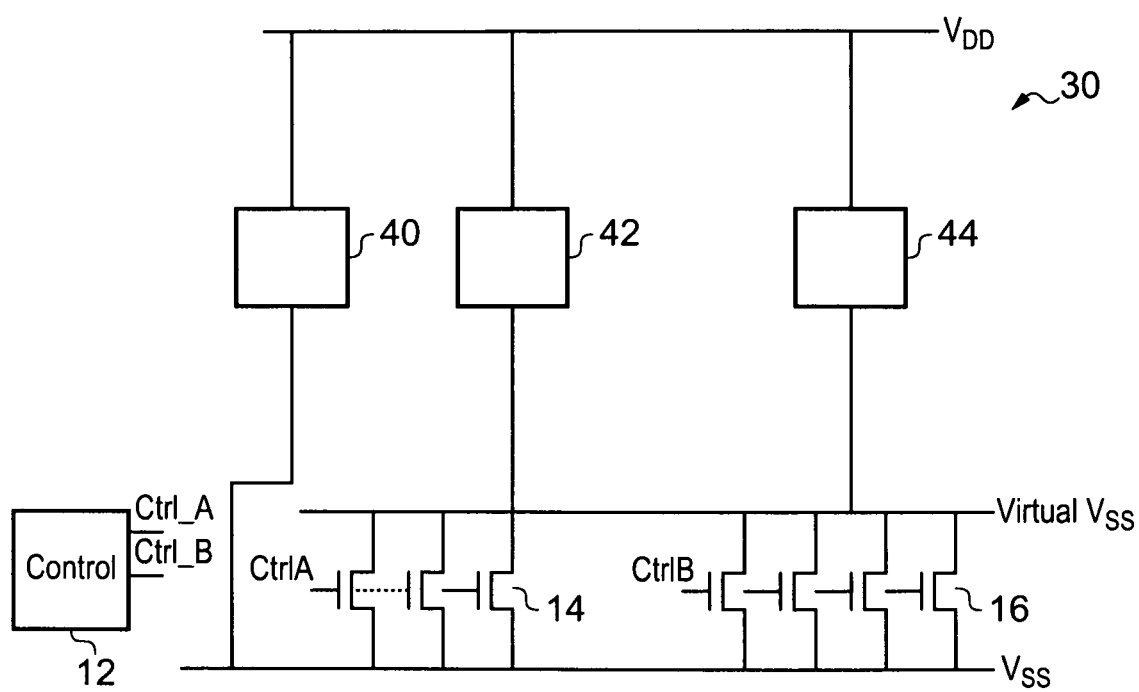
FIG. 3 shows an integrated circuit according to an embodiment of the present invention.

FIG. 3 shows an integrated circuit 30 according to an embodiment of the present invention. Integrated circuit 30 has a number of semiconductor devices 40, 42 and 44 that are powered by a voltage difference between a high voltage value VDD and a low voltage rail VSS. Semiconductor device 40 cannot enter an inactive or low performance state but is simply connected between the low and high power rail and thus, will always be powered by a voltage difference between VDD and VSS.

Semiconductor devices 42 and 44 however are arranged between the virtual power rail VSS and the high power rail VDD. They are controlled by power control circuitry 12 which controls two sets of transistors a first set 14 controlled by control signal A and a second set 16 controlled by control signal B. The first set of transistors controlled by control signal A are the transistors with the low threshold voltage while those controlled by control signal B are the ones with a higher threshold voltage. Thus, when devices 42 and 44 are operating in a low performance mode the transistors 14 are switched off and transistors 16 are switched on. In this mode, the devices 42, 44 operate with a lower operating frequency and have a reduced leakage voltage due to the high threshold voltages of the devices 16. If devices 42 and 44 are to enter a high performance mode then control A signal is asserted and the low threshold voltage transistors 14 are switched on. These can provide more current but also allow a higher leakage current to flow. Thus, with these devices on, the operating frequency of devices 42 and 44 can increase but the leakage current also increases.

If devices 42 and 44 are to enter inactive mode then both signals A and B are de-asserted and devices 14 and 16 are switched off. This allows the virtual VSS rail to float and the devices 42 and 44 are no longer powered.

Figure 4:
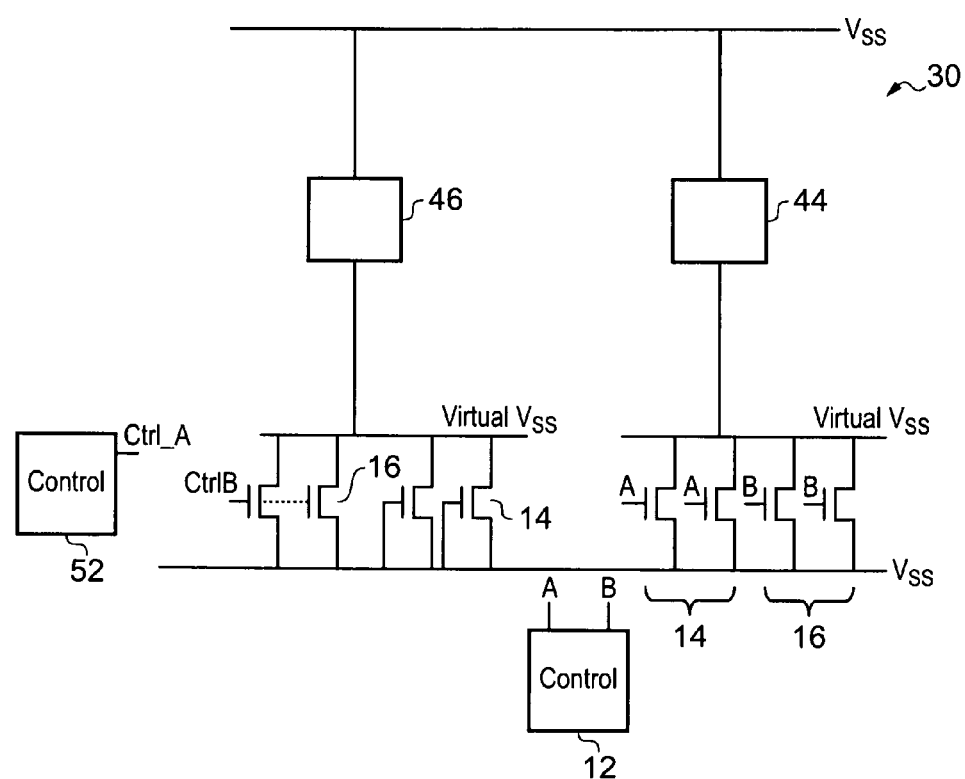
FIG. 4 shows an integrated circuit according to a further embodiment of the present invention.

FIG. 4 shows an alternative embodiment of an integrated circuit 30. In this embodiment semiconductor device 44 is controlled by control signals A and B as the semiconductor device 44 of FIG. 3 is. Semiconductor device 46 is however simply controlled by control signal B. Semiconductor device 46 is not on a critical path within the integrated circuit 30 and thus, never needs to operate in a high performance mode. Thus, in this device the wide transistors 14 are tied to an off state and can never be turned on. Thus, semiconductor device 46 is powered in response to the control signal B from the power control circuitry 52. Power control signal B is asserted when device 46 is to be on and is de-asserted when it is to enter the inactive mode. Thus, the supply of voltage to this device is controlled simply by transistors 16, transistors 14 being permanently off.

Figure 5:
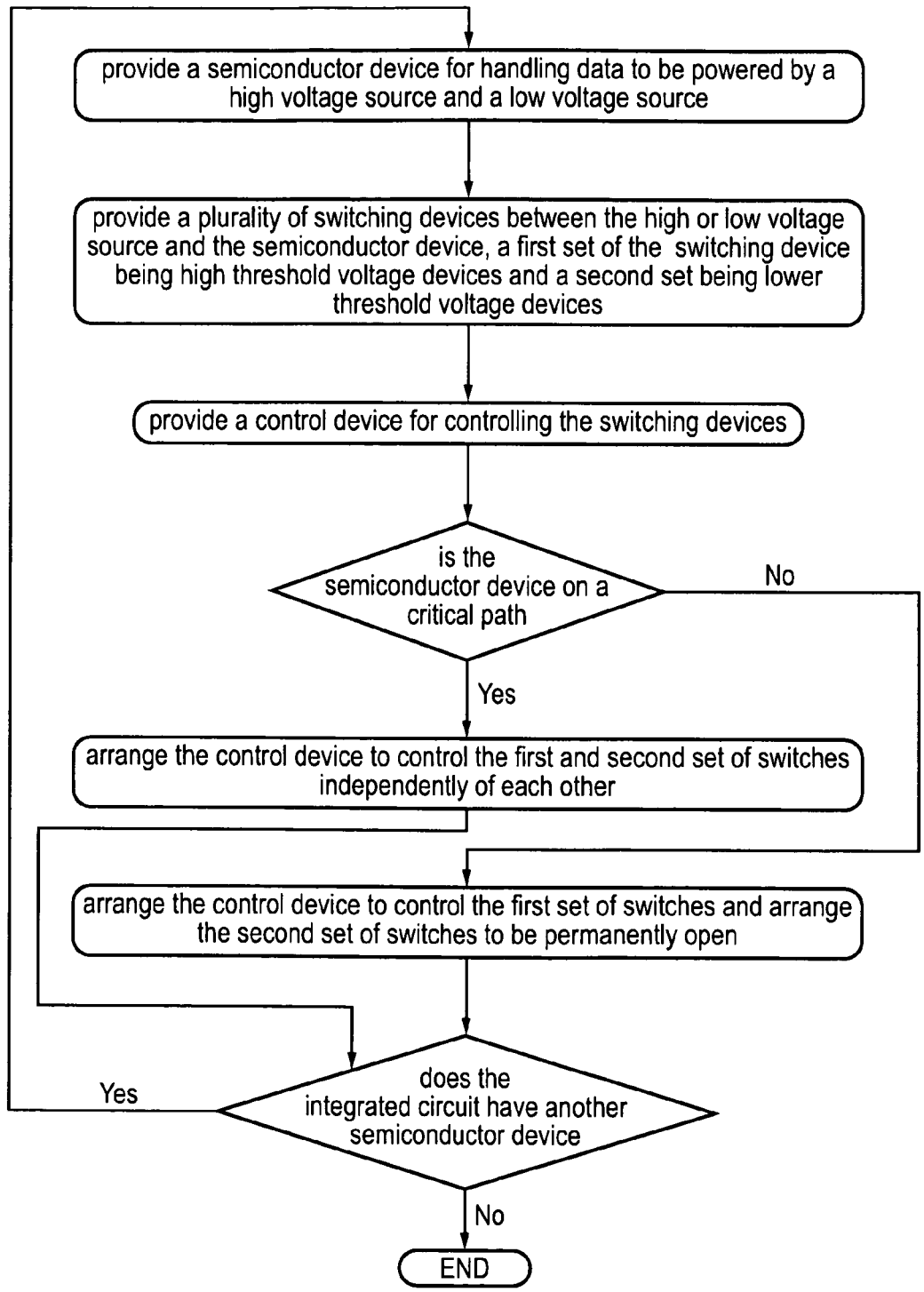
FIG. 5 shows a flow diagram illustrating steps in a method of designing a integrated circuit according to an embodiment of the present invention.

FIG. 5 shows steps in a method of designing a semiconductor device according to an embodiment of the present invention. Initially at least one semiconductor device for handling data is provided and then a plurality of switching devices are provided between the at least one semiconductor device and the high or low voltage sources. A first set of the switching devices are high threshold devices and a second set are low threshold voltage devices. A control device for controlling the switching devices is then provided and it is determined if the device is on a critical path. If it is on a critical path then the control device is arranged to control the first and second set of switches independently of each other. This is done so that the device on the critical path can enter a high performance mode of operation where all switches are turned on, an inactive mode where they are all off and a low performance mode of operation where only the high threshold voltage switching devices are turned on.

If it is determined that the semiconductor device is not on a critical path then the control devices are arranged to control just the first set of switches and the second set of switches are left permanently open. This precludes this semiconductor device from ever being in the high performance mode of operation but this is fine as it is not on a critical path.

The method then determines if the integrated circuit requires another semiconductor device. If it does the steps of the method are repeated if it does not then the design is complete.

It should be noted that this method could be performed by a computer program and thus, the design of such a system can be performed automatically and devices can be provided that can operate as high performance devices, low performance devices or inactive devices or a subset of the above.

Figure 6:
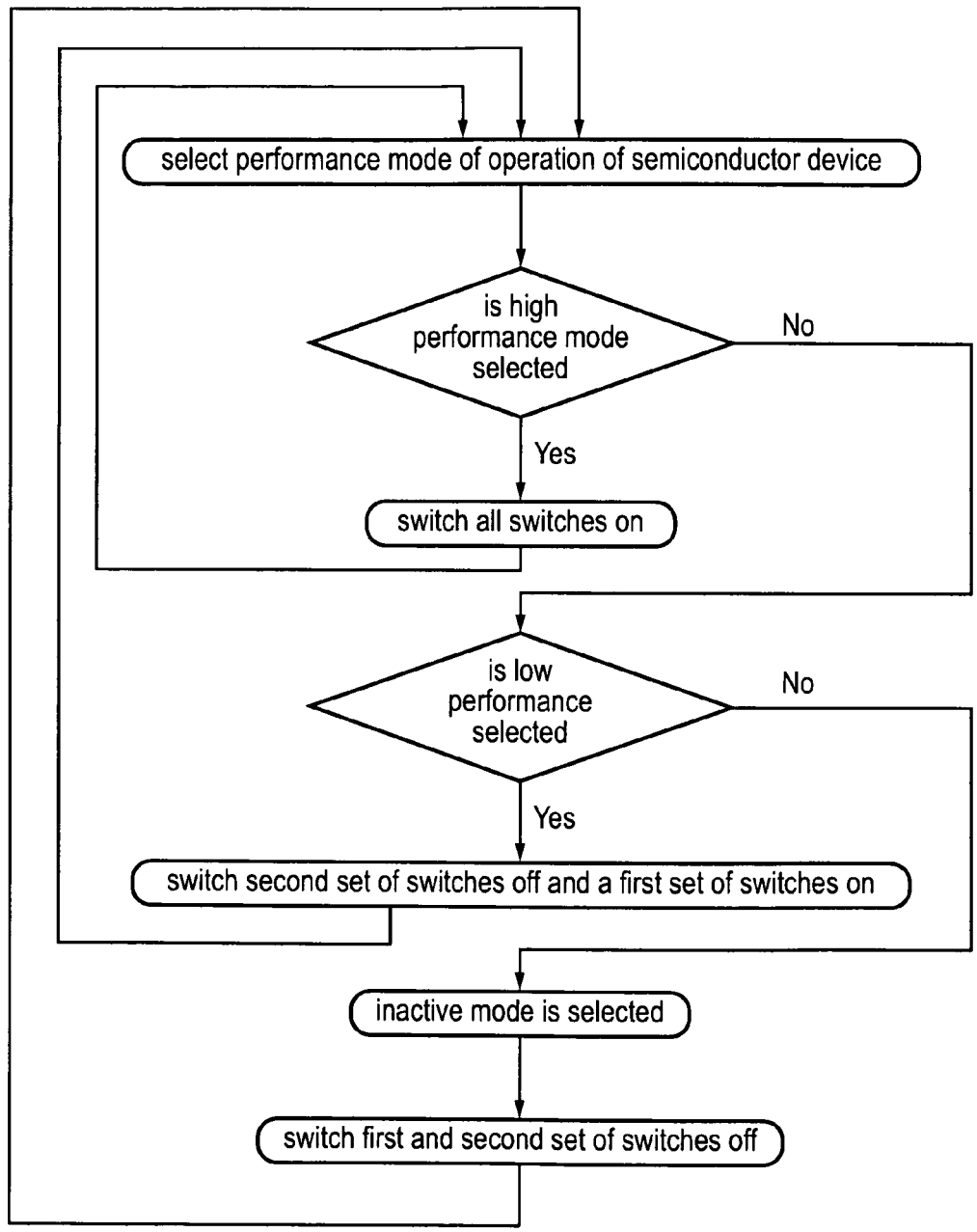
FIG. 6 schematically shows depth in a method of selecting a mode of operation of a semi conductor device within an integrated circuit according to an embodiment of the present invention.

FIG. 6 shows a method of selecting a performance mode of operation of a semiconductor device according to an embodiment of the present invention.

The performance mode of operation is to be selected. If it is the high performance mode that is selected then all the switches are switched on.

If it is the low performance mode then the second switch of switches is switched off and the first set of switches are or remain switched on. This results in current to the device and leakage currents are reduced.

If an inactive mode that is selected then both the first and second set of switches are switched off and the device is no longer powered.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. An integrated circuit comprising:
a semiconductor device for handling data;
a power source for powering said semiconductor device, said power source comprising a two voltages sources, a high voltage source for supplying a high voltage level and a low voltage source for supplying a low voltage level;
a plurality of switching devices arranged between at least one of said two voltage sources and said semiconductor device;
a control device for controlling a first set of said plurality of switching devices to connect one of said two voltage sources to said semiconductor device and for controlling a second set of said plurality of switching devices to connect said one of said two voltage sources to said semiconductor device; wherein
at least some of said first set of said plurality of switching devices have a higher resistance when closed and providing a connection than at least some of said second set of said plurality of switching devices such that when said first set of said plurality of switching devices connect said semiconductor device to said one of said two voltage sources said semiconductor device operates with a lower performance than when said second set of said plurality of switching devices connect said semiconductor device to said one of said two voltage sources;
wherein said integrated circuit is configured to operate in one of three modes, an inactive mode where said semiconductor device is isolated from at least one of said voltage sources, a low performance mode where said semiconductor device is connected to said one of said high or low voltage sources by said first set of switching devices and is clocked at a first frequency, and a high performance mode where said semiconductor device is connected to said one of said high or low voltage sources by at least said second set of switching devices and is clocked at a second frequency, said second frequency is higher than said first frequency.

2. An integrated circuit according to claim 1, wherein said first set of said plurality of switching devices comprise switching devices at least some of which have a higher threshold voltage than switching devices of said second set of switching devices.

3. An integrated circuit according to claim 1, wherein said plurality of switching devices comprise transistors, at least some of said transistors of said first set of switching devices having a lower gate width than at least some of said transistors of said second set of switching devices.

4. An integrated circuit according to claim 1, wherein in said high performance mode said semiconductor device is connected to said one of said high or low voltage sources by all of said plurality of switches.

5. An integrated circuit according to claim 1, wherein said semiconductor device comprises a semiconductor memory device.

6. An integrated circuit according to claim 1, comprising a further semiconductor device, said further semiconductor device being connected to said one of said high or low voltage sources by a plurality of switching devices comprising a first and second set, wherein said further semiconductor device is configured such that said second set of switching devices are configured to be always open such that said further semiconductor device is configured to operate either in an inactive mode where all of said plurality of switching devices are open and said further semiconductor device is isolated from said one of said high or low voltage sources or in a low performance mode where said first set of said plurality of switching devices connect said at least one further semiconductor device to said one of said high or low voltage source.

7. A method of designing an integrated circuit comprising
providing at least one semiconductor device for handling data to be powered by a high voltage source and a low voltage source;
providing a plurality of switching devices between at least one of said high or low voltage sources and said at least one semiconductor device;

providing a control device for controlling a first set of said plurality of switching devices to connect said at least one of said high or low voltage sources to said at least one semiconductor device and for controlling a second set of said plurality of switching devices to connect said at least one of said high or low voltage sources to said at least one semiconductor device; wherein at least some of said first set of said plurality of switching devices have a higher resistance when closed and providing a connection than at least some of said second set of said plurality of switching devices such that when said first set of said plurality of switching devices connect said semiconductor device to said one of said voltage sources said at least one semiconductor device operates with a lower performance than when said second set of said plurality of switching devices connect said at least one semiconductor device to said one of said voltage sources;

wherein said integrated circuit is configured to operate in one of three modes, an inactive mode where said semiconductor device is isolated from at least one of said voltage sources, a low performance mode where said semiconductor device is connected to said one of said high or low voltage sources by said first set of switching devices and is clocked at a lower frequency, and a high performance mode where said semiconductor device is connected to said one of said high or low voltage sources by at least said second set of switching devices and is clocked at a higher frequency, said higher frequency is higher than said lower frequency.

8. A method of designing an integrated circuit according to claim 7, further comprising determining that said at least one semiconductor device is not on a critical path within said integrated circuit and configuring said control device to control said second set of switches to be always open such that said at least one semiconductor device is configured to operate in an inactive mode where it is isolated from said at least one of said high or low voltage source and in a low performance mode where it is connected to said at least one of said high or low voltage source by said first set of switches.

9. A method according to claim 8, wherein said semiconductor device comprises a memory device.

10. A non-transitory computer readable storage medium, said medium carrying a computer program, the computer program configured to cause a computer system to perform a method of designing an integrated circuit according to claim 7.

11. A method of controlling a mode of operation of a semiconductor device for handling data comprising the steps of:
initiating a high performance mode by connecting said semiconductor device to a voltage source via a plurality of switching devices and clocking said semiconductor device at a first frequency;
initiating a low performance mode by connecting said semiconductor device to said voltage source via a subset of said plurality of switching devices, said subset comprising switching devices with a higher resistance when turned on than at least some of said plurality of switching devices not within said subset and clocking said semiconductor device at a second frequency, said second frequency is lower than said first frequency; and
initiating an inactive mode by isolating said semiconductor device from said voltage source by said plurality of switching devices.

12. An integrated circuit comprising:
a semiconductor device for handling data;
a power source for powering said semiconductor device, said power source comprising a two voltages sources, a high voltage source for supplying a high voltage level and a low voltage source for supplying a low voltage level;
a plurality of switching devices arranged between at least one of said two voltage sources and said semiconductor device;
a control device for controlling a first set of said plurality of switching devices to connect one of said two voltage sources to said semiconductor device and for controlling a second set of said plurality of switching devices to connect said one of said two voltage sources to said semiconductor device; wherein at least some of said first set of said plurality of switching devices have a higher resistance when closed and providing a connection than at least some of said second set of said plurality of switching devices such that when said first set of said plurality of switching devices connect said semiconductor device to said one of said two voltage sources said semiconductor device operates with a lower performance than when said second set of said plurality of switching devices connect said semiconductor device to said one of said two voltage sources; and
a further semiconductor device, said further semiconductor device being connected to said one of said high or low voltage sources by a plurality of switching devices comprising a first and second set, wherein said further semiconductor device is configured such that said second set of switching devices are configured to be always open such that said further semiconductor device is configured to operate either in an inactive mode where all of said plurality of switching devices are open and said further semiconductor device is isolated from said one of said high or low voltage sources or in a low performance mode where said first set of said plurality of switching devices connect said at least one further semiconductor device to said one of said high or low voltage source.

13. A method of designing an integrated circuit comprising
providing at least one semiconductor device for handling data to be powered by a high voltage source and a low voltage source;
providing a plurality of switching devices between at least one of said high or low voltage sources and said at least one semiconductor device;
providing a control device for controlling a first set of said plurality of switching devices to connect said at least one of said high or low voltage sources to said at least one semiconductor device and for controlling a second set of said plurality of switching devices to connect said at least one of said high or low voltage sources to said at least one semiconductor device; wherein at least some of said first set of said plurality of switching devices have a higher resistance when closed and providing a connection than at least some of said second set of said plurality of switching devices such that when said first set of said plurality of switching devices connect said semiconductor device to said one of said voltage sources said at least one semiconductor device operates with a lower performance than when said second set of said plurality of switching devices connect said at least one semiconductor device to said one of said voltage sources; and
determining that said at least one semiconductor device is not on a critical path within said integrated circuit and configuring said control device to control said second set of switches to be always open such that said at least one semiconductor device is configured to operate in an inactive mode where it is isolated from said at least one of said high or low voltage source and in a low performance mode where it is connected to said at least one of said high or low voltage source by said first set of switches.

\* \* \* \* \*